United States Patent [19]

Curtice

[11] 4,165,459
[45] Aug. 21, 1979

[54] TIME INTERVAL MEASUREMENT

[75] Inventor: Walter R. Curtice, West Windsor, N.J.

[73] Assignee: RCA Corporation, New York, N.Y.

[21] Appl. No.: 869,643

[22] Filed: Jan. 16, 1978

[51] Int. Cl.² .................... G01R 23/02; H03K 21/30
[52] U.S. Cl. .................... 235/92 TF; 235/92 T; 235/92 FQ; 235/92 CC; 235/92 R; 324/187; 364/569
[58] Field of Search ............ 235/92 FQ, 92 T, 92 TF, 235/92 CC, 92 DE; 364/569, 484; 324/187; 328/129

[56] References Cited
U.S. PATENT DOCUMENTS

| | | | |
|---|---|---|---|
| 2,665,411 | 1/1954 | Frady | 324/187 |
| 3,611,134 | 10/1971 | McDowell | 324/187 |
| 3,801,917 | 4/1974 | Weinstein | 235/92 T |
| 3,840,174 | 10/1974 | Craft | 235/92 T |
| 4,031,373 | 6/1977 | Beckwith | 235/92 FQ |
| 4,079,315 | 3/1978 | Mohr | 235/92 T |

*Primary Examiner*—Joseph M. Thesz
*Attorney, Agent, or Firm*—H. Christoffersen; Joseph D. Lazar; Raymond E. Smiley

[57] ABSTRACT

The interval between arrival of two time displaced signals is measured with a resolution less than 0.5 nanoseconds by electronic vernier techniques utilizing transferred electron logic device circuits. The first arriving signal triggers a first clock generator of pulse period $T_C$, the pulses from which are counted by a first counter and a second counter. The second arriving signal triggers a second clock pulse generator having a pulse period $T_V$, the first pulse therefrom disabling the first counter at a count of M. As $T_V < T_C$ coincidence of the pulses from the two clock pulse generators will eventually occur causing disabling of the second counter at a count of N. Time interval $\Delta T$ is computed from the formula: $\Delta T = (N-1)T_C - (N-M)T_V$.

7 Claims, 5 Drawing Figures

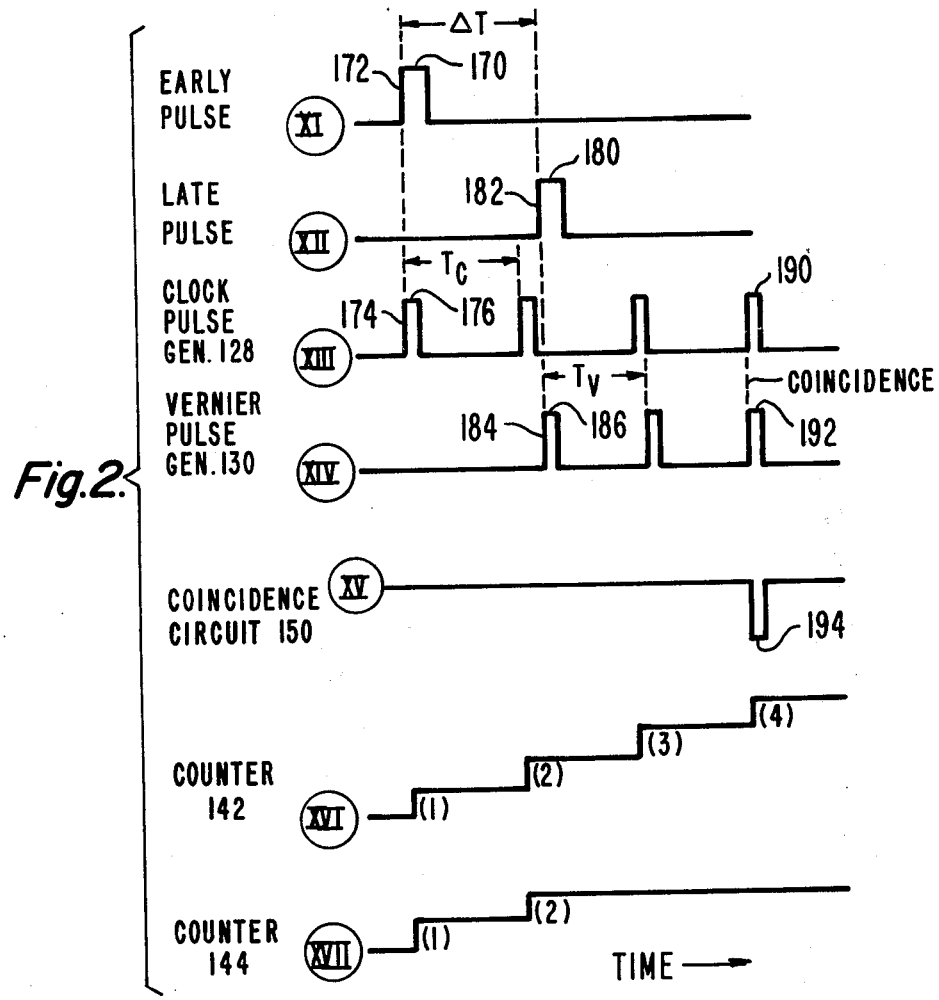
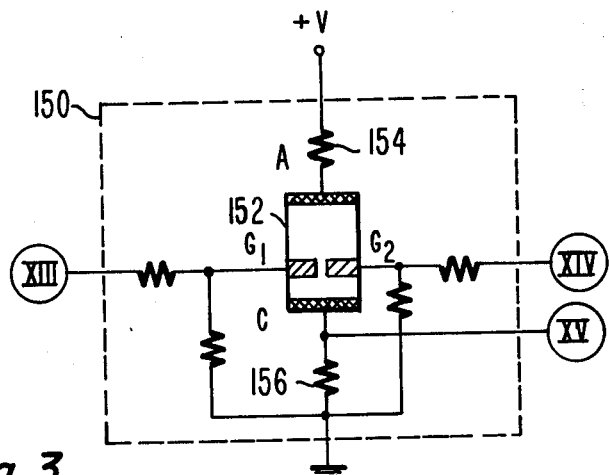

TIME INTERVAL MEASUREMENT

The Government has rights in this invention pursuant to Contract No. N00039-75-C-0225 awarded by the Department of the Navy.

CROSS REFERENCE TO RELATED PATENT APPLICATIONS

This application is related to the following copending applications: U.S. application, Ser. No. 792,418, filed Apr. 29, 1977, entitled "Triggered Burst Generator," U.S. application, Ser. No. 856,794, filed Dec. 2, 1977, entitled "Threshold Gate," U.S. application, Ser. No. 858,291, filed Dec. 7, 1977, entitled "Time Displaced Signal Sorting Apparatus," and U.S. application, Ser. No. 862,191, filed Dec. 19, 1977, entitled "Pulse Train Generator," all by W. R. Curtice.

BACKGROUND OF THE INVENTION

Bearing finding equipment, such as time difference of arrival (TDOA) systems and equipment for laboratory measurements of frequency and time delay in high speed circuits require high resolution time interval measurement. D. Martin (Electronic Design, Nov. 24, 1974, pp. 162-167) has discussed the principles of time interval measurements by various techniques.

Two techniques are presently useful for achieving subnanosecond resolution for single event measurements. The first method is a vernier technique which is used in vernier time interval meters. An example of such a meter is the Model 796 time interval meter made by the Eldorado Instrument Co. of Pleasant Hill, Calif. in which a relatively low frequency clock, such as a stable triggerable 100 MHz clock, is used. Because such relatively low frequency logic circuits are used, the measurement time is at least one microsecond and a rate at which new measurements which can be taken is therefore limited to less than one MHz.

R. G. Baron (Proceedings, IRE, January 1957, pp. 21-30) describes the techniques of vernier time measurement by which it is possible to measure non-periodic and asynchronous time intervals accurately. The Baron apparatus utilizes three clock pulse generators (one free running and two startable upon command), three counters to count the pulses produced by respective pulse generators, and two coincidence circuits to define coincidence between pulses of the free running pulse generator and each of the other generators. The Baron interval measurement apparatus, thus, utilizes a relatively large number of components and a complex circuit.

In accordance with the second technique, time spaced pulses of unknown separation and a signal from an oscillator of known period are processed by an AND gate producing a series of pulses. The pulses are then counted by means of a series of frequency dividers. The resolution of this system is ±1 period of the oscillator. Since the best dividers presently available (IEEE Spectrum, March 1977, pp. 41-47) operate at a maximum frequency of 4 GHz, the best precision possible by this technique is ±0.25 nanoseconds, that is, a resolution of 0.5 nanoseconds.

SUMMARY OF THE INVENTION

Apparatus for measuring the time interval between the arrival of an early pulse and late pulse comprises means responsive to the arrival of the early pulse for producing a first series of pulses at period $T_C$, the first pulse therefrom correlating with the occurrence of the early pulse, and first and second means for counting the pulses. The first counting means has a disable terminal responsive to a signal for maintaining the counting means at the count it contains upon receipt of the signal. Also included is a means responsive to the arrival of a late pulse for producing a second series of pulses of period $T_V < T_C$ where the first pulse therefrom correlates with the occurrence of the late pulse and is the disable signal disabling the first counter at a count of M. A means is included which is responsive to the first coincident arrival of an early series pulse and a late series pulse for producing a coincidence signal indicative thereof. Also included is a means responsive to the coincidence signal and to the count contained in the first and second counters for determining the time interval $\Delta T$ between the arrival of the early and late pulse, where $\Delta T = (N-1)T_C - (N-M)T_V$.

BRIEF DESCRIPTION OF THE DRAWING

FIG. 2 is a series of waveforms useful in understanding operation of system of FIG. 1;

FIG. 3 is a schematic diagram of a coincidence circuit useful in the system of FIG. 1;

DETAILED DESCRIPTION OF THE PREFERRED EMBODIMENT

Figure 1:
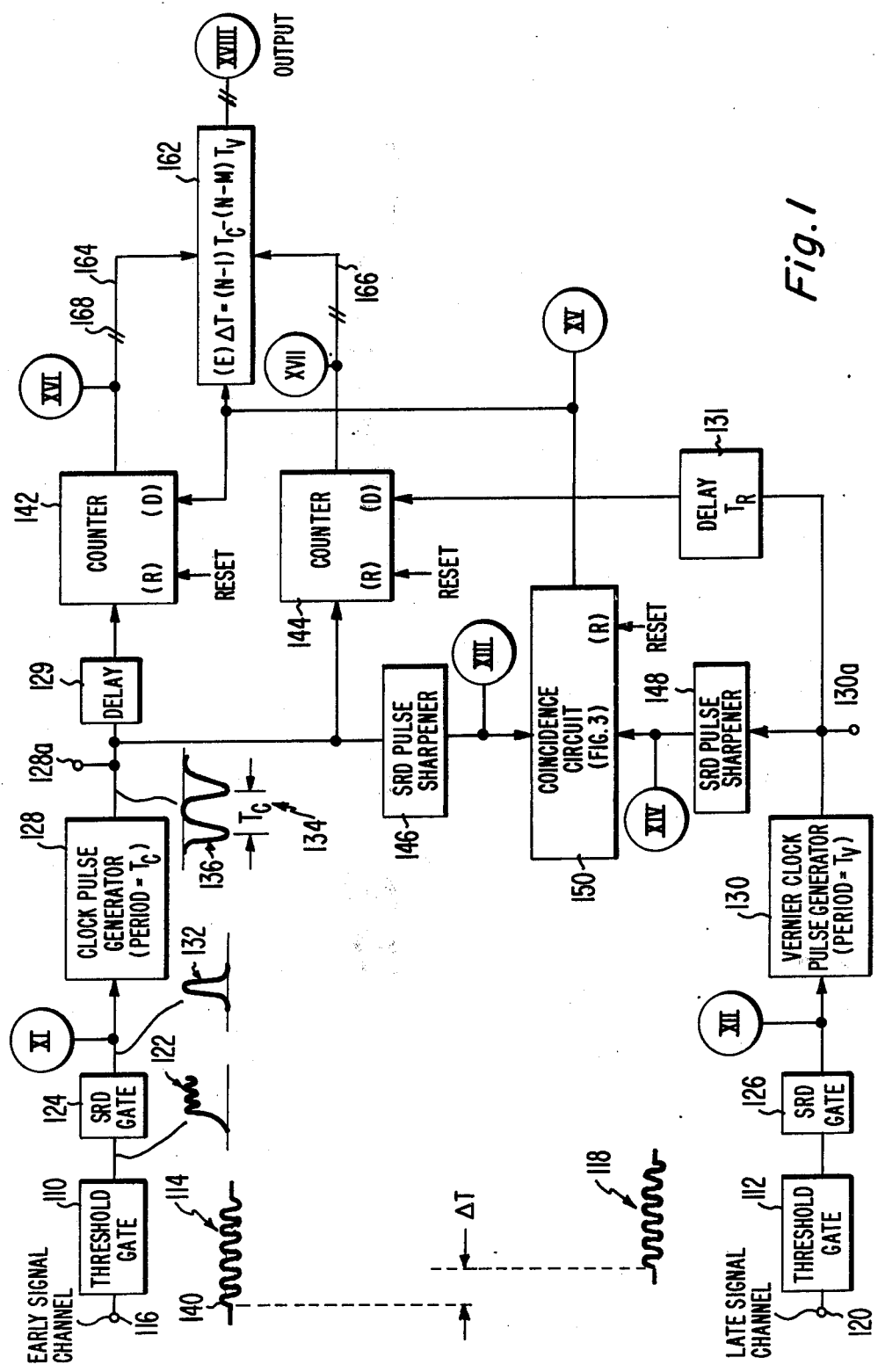
FIG. 1 is a block schematic of a system for generating a time of arrival measurement of a pair of pulses such as RF bursts in the GHz range in accordance with the present invention.

Referring to FIG. 1, there is shown first and second threshold gates 110 and 112 which are adapted to receive, respectively, a relatively early burst of radio frequency (RF) signals, illustrated as waveform 114 at terminal 116 and a relatively late burst of RF signals, illustrated as waveform 118, at input terminal 120. The time interval between arrival of the respective signals is defined as $\Delta T$. The input signals may be derived from any of a number of sources. For example, in direction finding equipment, a radio frequency pulse from a source (not shown) may be radiated into the atmosphere, strike an object, the angular direction of which is to be determined and reflect back to first and second spaced antennas (not shown), which are amplified to produce the early and late signals, respectively. The time between the arrival of the two signals which is to be determined, may be only a few tenths of a nanosecond. When the time interval between the arrival of the two signals is known, the angular location of the target may be determined by well known techniques.

A type of threshold gate suitable for the instant application is described in the aforementioned U.S. patent application, Ser. No. 856,794, and is incorporated by reference herein. The threshold gate to be described in detail in connection with FIGS. 4 and 5, hereinafter, comprises a transferred electron logic device (TELD) having a Schottky barrier gate to which is applied an RF burst signal. The TELD is biased such that when the RF burst occurs, the TELD is triggered to domain formation, transitioning thereby from a relatively high D.C. current passage device to a relatively low oscillating current device during the presence of the RF burst.

A field effect transistor (FET) cascaded with the TELD amplifies the signal produced thereby producing waveform 122 comprising a relatively low amplitude signal when no RF burst signal is present at the threshold gate and producing a relatively high amplitude signal when the RF signal is present.

Threshold gates 110 and 112 are coupled respectively by a pair of step recovery diode (SRD) gates 124 and 126 to a pair of triggerable clock pulse generator circuits 128 and 130 at terminals XI and XII, respectively. Terminals in FIGS. 1 and 3 indicated by large circles enclosing Roman numerals are keyed to waveform numbers illustrated in FIG. 2. The waveforms of FIG. 2 are idealized in shape.

Clock pulse generator circuit 128 is responsive to a relatively short duration positive pulse illustrated as waveform 132 for producing at its output terminal 128a a plurality of spaced pulses (waveform 134) of period $T_C$, which in one exemplary embodiment is 1.2 nanoseconds. The first such pulse, 136 correlates to the leading edge 140 of RF signal 114. There will, however, be a time delay due to the delays in threshold gate 110, SRD gate 124, and generator 128, the delays being of known fixed values.

Clock pulse generators of the type described having internal delays of only a few nanoseconds are known. One such triggerable clock pulse generator utilizing two transferred electron logic devices (TELDs), is described in U.S. Pat. No. 4,000,415, issued Dec. 28, 1976. Another such triggerable clock pulse generator is described in the aforementioned U.S. patent application, Ser. No. 792,418, which utilizes a cascaded arrangement of delays in field effect transistor devices. A third triggerable clock pulse generator is described in U.S. patent application, Ser. No. 862,191, filed Dec. 19, 1977, which utilizes a single TELD and a series delay line in a resonant circuit.

All the clock pulse generators described in the above patent applications and patent, require a fast rise time short duration pulse for triggering. Because threshold gates 110 and 112 do not provide such a pulse, step recovery diode gates 124 and 126 are needed. Step recovery diode gate 124 (and identical gate 126) comprises a step recovery diode capacitively coupled in parallel with threshold gate 110 and a second step recovery diode capacitively series coupled therefrom to terminal XI. The purpose of step recovery diode gate circuit 124 is to cut off the input pulse 122 to produce a narrow output pulse 132. In addition, circuit 124 may be used to sharpen the rise time of waveform 122. Such a step recovery gate circuit is described in "Simpler Digital Circuits in a Snap," By Bernard Siegel, in Electronics, vol. 42, No. 12, pp. 105-108, June 9, 1969.

If the first arriving RF signal can arrive at either terminal 116 or terminal 120, as is the case is some applications, a circuit must be provided to effectively channel the early pulse to terminal XI and the late pulse to terminal XII. Such a pulse directing circuit is described in the aforementioned U.S. patent application, Ser. No. 858,291.

Clock pulse generator 130 is identical to clock pulse generator 128 except for producing a clock pulse period $T_V$ at terminal 130a, where $T_V$ is less than $T_C$ and in one exemplary embodiment is 0.8 nanoseconds. The periods $T_C$ and $T_V$ and the number of pulses which each clock pulse generator is required to produce are determined by the desired resolution of the apparatus of FIG. 1. Resolution expressions for a given value of $T_C$ and $T_V$ will be described hereinafter.

Terminal 128a of pulse generator 128 is coupled through delay circuit 129 to an input terminal of a first counter 142 and to a substantially identical second counter 144. Each of the counters 142 and 144 has a disable (D) terminal which, upon receipt of a disable pulse, ceases to count clock pulses but maintains the then existing counts. Each of the counters also has a reset (R) terminal, which upon receipt of a reset pulse from a source (not shown) resets the counter to a zero count. Counters 142 and 144 may be commercially available counters and may utilize emitter coupled logic circuits for high speed operation, such as for counting pulses in the gigahertz range. One such counter is the Motorola MECLIII, MC 1966 divide-by-ten counter.

Output terminal 128a of generator 128 and output terminal 130a of generator 130 are coupled via respective SRD pulse shaper circuits 146 and 148 to respective input terminals of a coincidence circuit 150 at terminals XIII and XIV, respectively. Terminal 130a is also coupled via delay 131 to the D terminal of counter 144. SRD pulse shaper circuits 146 and 148 may be identical in structure to SRD gates 124 and 126. Because the pulses applied to pulse shapers are already of short duration, only the leading and trailing edges need be sharpened for fast rise and fall times. If the chosen clock pulse generator type produces sufficiently fast rise and fall times of sufficiently short duration, circuits 146 and 148 are not needed. Therefore, terminal 128a is directly connected to terminal XIII while terminal 130a is directly connected to terminal XIV.

Coincidence circuit 150 upon receipt of coincident pulses at its input terminals XIII and XIV produces a pulse of desired polarity at terminal XV. The restrictions upon the input pulse width are described in a report entitled "A Logic Module Using Transferred-Electron Logic Devices for Precision Time Interval Measurements," by W. R. Curtice, Naval Electronic Systems Contract No. N00039-75-C-0225, September 1977. Assuming triangular pulses are produced, proper coincidence operation will occur if the half-height pulse width is at least equal to $T_R$ and less than $2T_R$, where $T_R = T_C - T_V$, as described in the report. Depending upon the type of coincidence circuit, it may require a reset pulse applied at terminal R. A number of circuits may be used for coincidence circuit 150. One such circuit, illustrated in FIG. 3, to which attention is now directed, comprises a split gate Transferred Electron Logic Device (TELD) 152 having an anode (A) terminal, a cathode (C) terminal and a pair of Schottky barrier gates $G_1$ and $G_2$, each equidistant from the TELD anode and each coupled to receive negatively directed input pulses at terminals XIII and XIV, respectively. Bias is provided by source $+V$ series connected with anode resistor 154, TELD 152 and cathode resistor 156. Output terminal XV is coupled to the junction of resistor 156 and TELD 152. Split gate TELD 152 is biased in such a manner that in the absence of negatively directed pulses at both input terminals XIII and XIV, the TELD does not produce domain formation and the current therethrough is relatively high as is the voltage at terminal XV. When both clock pulse generators 128 and 130 concurrently produce a pulse, sufficient bias is present in TELD 152 to cause domain formation lowering the current therethrough and therefore the voltage at terminal XV.

Returning now to FIG. 1, terminal XV of coincidence circuit 150 is coupled to the D terminal of counter 142 and to the enable (E) terminal of a computing device 162. Computing device 162 also receives inputs from counter 142, terminal XVI and counter 144, terminal XVII on multiconductor lines 164 and 166, respectively. All multiconductor lines are designated as such by the cross hatch symbol 168. At the time that coincidence circuit 150 produces a coincidence pulse at terminal XV counter 144 contains a count of M and vernier counter 142 contains a count of N.

Computing device 162 controlled by the coincidence pulse at terminal XV computes the time ΔT between the arrival of the early pulse at terminal XI or 116 and the late pulse at terminal XII or 120 from the formula: $\Delta T = (N-1)T_C - (N-M)T_V$ and produces a result at terminal XVIII (not illustrated in FIG. 2). Computing device 162 may be a general purpose computer programmed to make the computation or may be comprised of dedicated hardware to form a calculation of the formula as is well known to those skilled in the art.

Operation of the circuit of FIG. 1 is as follows. Initially a reset pulse from a circuit (not shown) resets counters 142 and 144 to a count of zero and if required resets coincidence circuit 150 to look for pulse coincidence thereat. Thereafter when a burst of RF energy signals such as 114 appears at terminal 116, SRD gate 124 produces an early pulse idealized as pulse 170, (FIG. 2), at terminal XI. The leading edge 172 of pulse 170 triggers clock pulse generator 128 to produce a series of pulses which are shaped by SRD pulse sharpener 146 and appear at terminal XIII of period $T_C$. The leading edge 156 of the first such clock pulse 176 is substantially coincident with the leading edge 172 of early pulse 170. Actually, as mentioned earlier, pulse 176 may be delayed by some small amount so long as the same delay is present in Vernier pulse generator 130. However, the smaller the delay the more measurements per unit time can be made by the apparatus of FIG. 1. Successive clock pulses produced by generator 128 beginning with pulse 174 are counted both by counters 142 as appearing at terminal XVI and by counter 144 as appearing at terminal XVII.

Thereafter, when a late pulse 180 appears at terminal XII, the leading edge 182 thereof triggers clock pulse generator 130 to produce pulses at terminal XIV of period $T_V$. The leading edge 184 of the first such pulse, 186 disables counter 144 at the count, M, it contains, which in the example situation of FIG. 2, is two. The value of M is applied to computing device 162, while counter 142 continues to count clock pulses from generator 128.

The circuit construction must be such that if pulses are present simultaneously at terminal 128a and terminal 130a, counter 144 receives the disable pulse from terminal 130a time $T_R$ later than the counting pulse from terminal 128a. Delay circuit 131 provides this extra delay. This permits counter 144 to count the pulse even if occurring simultaneously with the pulse at terminal 130a.

Eventually a pulse from generator 128 coincides in time with a pulse from generator 130. In the FIG. 2 example, these pulses are 190 and 192. Coincidence of these pulses, which is a first coincidence of these pulses, causes coincidence circuit 150 to produce a pulse 194 at terminal XV. Pulse 194 disables counter 142 at a count of four in accordance with the example, which is the value N applied to computing device 162. Delay circuit 129 is used to provide a delay equal to that of SRD circuit 146 and coincidence circuit 150 diminished by the time $T_R$. This delay permits counter 142 to be disabled exactly at coincidence time plus the time delay $T_R$. This permits the counter 142 to count the last pulse should the terminals 128a and 130a produce simultaneous signals. A correct ΔT can now be calculated by the previous equation for all time differences.

Pulse 194 also enables computing device 162 to produce at output terminal XVIII a signal which represents the time interval ΔT between the arrival of early pulse 170 and late pulse 180 at terminals XI and XII, respectively, or terminals 116 and 120, respectively.

The resolution desired of the system and the maximum time differential between early and late pulses (or the range of the signals they represent) determines the value of $T_C$ and $T_V$ and determines the number of pulses which pulse generators 128 and 130 must be capable of producing to generate coincidence. The resolution of the system which is the smallest time differential capable of being measured is:

$$T_R = T_C - T_V \tag{1}$$

In the preferred embodiment, $T_R = 1.2 - 0.8 = 0.4$ ns. The measurement rate, that is the maximum number of time measurements possible per unit of time is limited by the choice of $T_R$, $T_C$, and the measurement range. Let $N_V$ be the number of pulses required to be produced by vernier pulse generator 130 for a given resolution. As there is one more vernier pulse than clock pulse over the time interval $(N_V - 1) T_V$ $$(N_V - 1)T_V = (N_V - 2)T_C \tag{2}$$

Rearranging formula (2) to determine the number of vernier pulses required produces:

$$N_V = 1 + T_C/T_R \tag{3}$$

For example if $T_C = 1.2$ ns as in the preferred embodiment, $T_R = 100$ picoseconds can be obtained by using $N_V = 12$ and $T_V = 1.1$ ns. The twelve pulses require 13.2 nanoseconds (ns). The ECL counters 142 and 144 require about 4 ns/decade before a count can be read. In addition several ns delay may be required for the SRD circuit 146 and coincidence circuit 150. Assuming a small range application, the minimum measurement time is then about 20 ns. This should be compared with the aforementioned Eldorado equipment which requires at least 1 μs for the same resolution. Thus the number of measurements possible per second is about two orders of magnitude greater. The range of time interval measurement is determined by the total number of clock pulses $N_C$. Specifically if $N_C = N_V$, then the maximum range $$R = T_C(2 + \frac{N_C - 3}{N_C - 1}) \tag{4}$$

By way of example if $T_C = 1.0$ ns and if $N_C = 11$ then range R = 2.8 ns.

Figure 4:
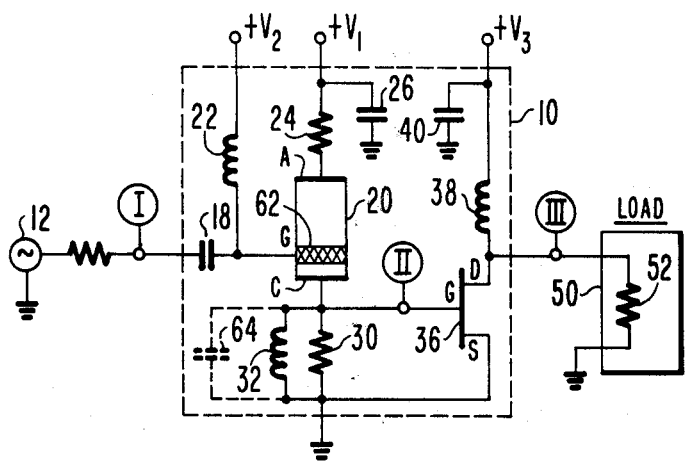
FIG. 4 is a monostable threshold gate circuit in accordance with the present invention.
Figure 5:
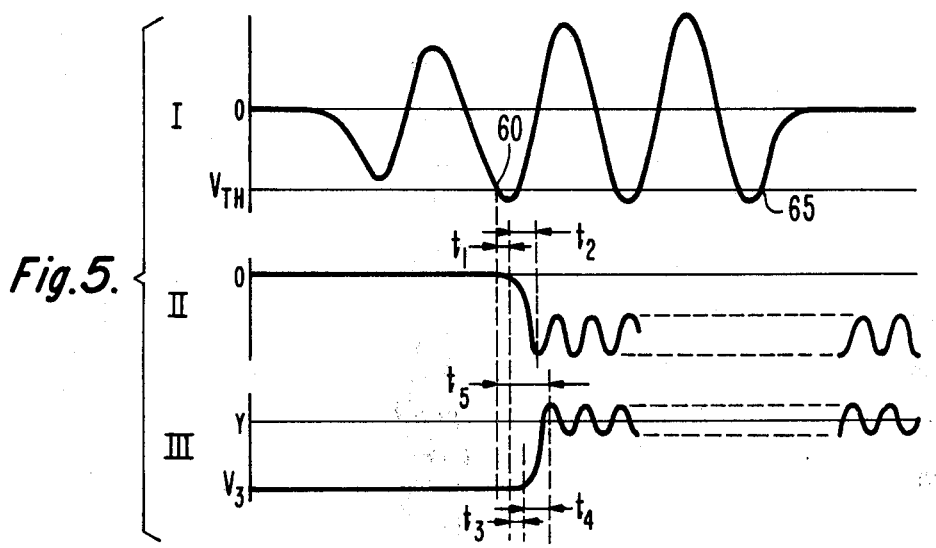
FIG. 5 is a set of three waveforms useful in understanding the operation of the circuit of FIG. 4.

Referring to FIG. 4, a threshold gate circuit 10 has coupled at its input terminal I a signal source 12. With reference to FIG. 5, where waveform numbers corresponds to terminal numbers in FIG. 4, threshold circuit 10 produces an output signal of one value, $V_3$, at terminal III when the input signal at terminal I is below (in magnitude) some preselected threshold value $V_{th}$. Conversely, when the input signal at terminal I goes above (in magnitude) value $V_{th}$, even briefly, threshold gate 10 produces at terminal III as oscillatory signal having an average value Y greater than $V_3$ which can be made to persist for a time on the order of 10 nanoseconds even if the input signal at terminal I drops below the threshold value.

Returning to FIG. 4, terminal I is A.C. coupled via coupling capacitor 18 to the gate (G) terminal of a transferred electron logic device (TELD) 20. Also coupled to the gate terminal is a gate bias source $V_2$ via an inductive choke 22. The anode of TELD 20 is coupled via resistor 24 to a bias source $V_1$. A noise suppression capacitor 26 is also coupled between the bias source $V_1$ and a source of reference potential such as ground. The cathode (C) of TELD 20 is coupled in parallel to a load resistor 30 and an inductive choke 32 which are, in turn, coupled to a source of reference potential such as ground. The values of $V_1$ and resistor 24 are such that the anode-to-cathode voltage differential of TELD 20 is about 90% of the voltage differential which causes domain formation in TELD 20. Resistor 24 and resistor 30 are chosen such that their sum is at least equal to $R_o$ (where $R_o$ is the low-field resistance, anode-to-cathode of TELD 20) and no larger than several times $R_o$. This requirement provides a load line for TELD 20 such that upon current reduction due to domain triggering, the anode-to-cathode voltage differential becomes large enough to sustain a travelling domain. The choice of resistor 24 and resistor 30 depends upon the desired quiescent operating condition of TELD 20, the desired triggering sensitivity, and the choice of RC time constant for the cathode circuit. The use of choke 22 permits use of D.C. bias from D.C. source $V_2$ to be applied directly to TELD 20 gate while providing essentially an infinite impedance to high frequency signals applied at terminal T. Likewise inductor 32 provides infinite impedance to high frequency signals at the cathode of TELD 20.

TELD 20 is coupled in cascade directly with an active device 36. Active device 36 having a transconductance $G_m$ is typically capable of driving a low impedance load of value $R_L$ while providing gain (i.e., $G_m \cdot R_L > 1$) and is capable of operating at subnanosecond speeds at which TELD 20 operates. A field effect transistor (FET) and more particularly, a type of FET known as a MESFET is preferable as active device 36. TELD 20 cathode is directly coupled at terminal II to the gate (G) of FET 36. The source (S) of FET 36 is coupled to a source of reference potential such as earth ground, while the drain (D) terminal is coupled via inductive choke 38 to a source of bias potential $V_3$. A noise suppression capacitor 40 is coupled between bias source $V_3$ and earth ground. The use of a choke 38 rather than a bias resistor (not shown) provides more gain in FET 36 with less power dissipation than with the use of a resistor.

The drain terminal of FET 36 is coupled to the output terminal III of threshold gate 10 which, in turn, is coupled to a load 50. Load 50 suitably comprises a relatively low impedance resistor 52 having a resistance $R_L$. Resistor 52 may take the form of a transmission line. Transmission lines typically have a characteristic impedance on the order of 50 or 100 ohms, or perhaps 200 ohms, all of which values are considered to be low impedance when compared to typical active device input impedances which are typically 1000 ohms or more.

Operation of the circuit of FIG. 4 is as follows. Bias supplies $V_1$ and $V_2$ are of values such that TELD 20 is biased to about 90% of the value required to cause domain formation. Bias current returns to ground through inductor 32. Therefore, in the absence of an input signal in excess of a preselected threshold voltage being applied at terminal I, the effective anode-to-cathode impedance of TELD 20 is relatively low (compared to the effective impedance when domain formation is occurring) and therefore the current through TELD 20 and consequently through inductor 32 is relatively high. With only D.C. bias passing through inductor 32, it exhibits substantially zero resistance. Consequently, the voltage drop across resistor 30, as applied to the gate of FET 36, is zero. The drain of FET 36 is biased through inductor 38 which functions as a load decoupling inductor. With a zero voltage applied to the gate of FET 36, the output terminal III at the drain is $V_3$.

When an input signal is applied to terminal I which does not go more negative than voltage $V_{th}$, the input voltage which triggers TELD 20 to domain formation, the circuit remains in what will hereinafter be known as the "OFF" or quiescent state, that is, with terminal II producing substantially zero voltage and terminal III consequently producing substantially $V_3$ voltage.

When the input signal exceeds (in magnitude) $V_{th}$ (see FIG. 5, waveform I, legend 60) TELD 20 gate-cathode voltage is lowered sufficiently that high field domain formation commences within TELD 20. The high field domain formation commences at a delay $t_1 + t_2$ after input voltage $V_{th}$ is reached. Time delay $t_1$, occasioned by the delay through device 20, is $100 \cdot 10^{-12}$ seconds or less. Time delay $t_2$ is caused by the rise time of the RC circuit formed by the resistor 30 and a capacitor 64 (illustrated in phantom). Capacitor 64 consists of the capacitance inherent in an imperfect inductor 32 and the input capacitance between gate and source of FET 36. Time $t_2$ is $200 \cdot 10^{-12}$ seconds or less.

Thus, within about $300 \cdot 10^{-12}$ or less seconds after the input signal exceeds $V_{th}$, the first of a series of high field domains occurs within TELD 20. These domains form at the anode edge 62 of the gate and travel to the anode of TELD 20. When one high field domain has travelled from gate (G) to anode (A), a new high field domain is formed at the gate and the process repeats. Waveform II of FIG. 2 does not show discrete voltage pulses due to individual domains being formed because the RC time constant of the TELD's cathode circuit causes an average voltage to persist with a smaller time varying voltage due to domains.

During the time that high field domains are being (serially) formed, relative to when they are not being formed, the effective impedance of TELD 20 increases and therefore the current through TELD 20 and thus through the network comprising resistor 30 and capacitor 64 decreases producing a lower voltage at terminal II. This voltage decrease occurs with the time constant associated with the resistor 30 and capacitor 64 network. The output voltage at terminal II oscillates with a period equal to the rate of field domain formation. The lowered output voltage at terminal II is reflected as an increase in output voltage at terminal III as applied to load 50. This condition in which a relatively high voltage is produced at terminal III will be hereinafter known as the "ON" state. Following time delay $t_3$ after the time the signal at terminal II begins to decrease in value, occasioned by delay in FET 36, the drain terminal of FET 36 begins to increase in value. After a further delay $t_4$ occasioned by the rise time $t_2$ and in addition the time constant of the drain circuit due to various capacitances to ground (not shown), the signal at the drain (D) of FET 36 reaches its maximum value. In one exemplary embodiment, $t_3 < 100 \cdot 10^{-12}$ seconds while $t_4$ is on the order of $400 \cdot 10^{-12}$ seconds. Thus, the total elapsed time from the point in time that the input signal at terminal I exceeds $V_{th}$ until FET 36 has produced a change in output signal level is illustrated in FIG. 5 as $t_5$ which is about $600 \cdot 10^{-12}$ seconds or substantially less than one nanosecond.

The circuit of FIG. 4 remains in the ON state even after the input signal at terminal I returns below $V_{th}$ for an extended period such as occurs at point 65. Such a circuit exhibits the property of being "monostable" in that following a suitable momentary input pulse, the output terminal remains in the ON state for a period of time and then turns to the OFF state. The input pulse must be above $V_{th}$ for a period of time at least equal to the domain formation time, which is typically much less than 100 ps. The duration of the ON state depends upon the operating point at TELD 20 and thus upon bias voltages $V_1$ and $V_2$ and further upon the values chosen for inductor 32, capacitor 64, and resistor 30, as will be described.

The cathode-to-ground circuit of TELD 20 responds to the current drop of TELD 20 with two different time constants. The first time constant is due to the resistor 30 and capacitor 64. This time constant is chosen to be larger than the domain formation time of TELD 20 in order that serial domain formation can occur after the input signal to the gate has gone below threshold value. The second time constant is determined by inductor 32 and resistor 30 and this time constant is large in comparison to the first time constant. The combination of resistor 30 and inductor 32 limit the maximum duration of the ON state since the TELD 20 cathode voltage must return to ground potential in a time determined by inductor 32 and resistor 30. In one working embodiment, the ON state is maintained for 10 nanoseconds.

By reducing the value of inductor 32 and reducing the bias voltage $V_1$, the circuit of FIG. 4 is made to exhibit thresholding properties with a short duration of ON state. Voltage $V_1$, however, must not be reduced so much as to not permit the domain sustaining voltage difference to exist between the anode and cathode of TELD 20 when a high field domain is triggered. Thus, this circuit exhibits monostable operation.

In one working embodiment, TELD 20 is a planar device constructed with an n-type gallium arsenide (GaAs) layer grown on a semi-insulating substrate of gallium arsenide material. It has:

$$n \times l \geq 10^{13}/cm^2 \text{ and } n \times d \geq 10^{12}/cm^2$$

where n is the donor density in the epitaxial layer, l is the cathode-anode separation and d is the epitaxial layer thickness. A choice of $n = 1 \times 10^{16}/cm^3$, $l = 35$ $\mu$m, $d = 2$ $\mu$m and anode to gate spacing of $28\mu$ would produce 25 to 40 percent of current drop in GaAs devices with low defect density, low trapping center density and a large low-field mobility.

In one working embodiment of the circuit of FIG. 4, the values of the various elements are as follows:

| | | | |
|---|---|---|---|
| Capacitor 4 | 100pF | Resistor 24 | 300 ohms |
| Capacitor 18 | 50pF | Resistor 30 | 100 ohms |
| Capacitor 26 | 100pF | Resistor 52 | 50 ohms |
| Capacitor 64 | 2pF | $V_1$ = 18V. | |
| Inductor 22 | 3.3$\mu$H | $V_2$ = +1.5V | |
| Inductor 32 | 3.3$\mu$H | $V_3$ = 5V | |
| Inductor 38 | 3.3$\mu$H | MESFET 36 RCA — MTC — T825 with $G_m$ = .035 mS | |

What is claimed is:

1. An apparatus having first and second input terminals adapted to received thereat an early pulse and a late pulse, respectively, comprising in combination:
   means responsive to the receipt of said early pulse at said first input terminal for producing a first series of said clock pulses of predetermined period $T_C$, the first pulse therefrom correlated to the occurrence of said early pulse at said first terminal;
   first counting means responsive to said first series of pulses from said clock pulse means for counting said pulses of said first series and for producing a signal indicative of the count;
   second counting means also responsive to said first series of pulse from said clock pulse means for counting said pulses of said first series and for producing a signal indicative of the count;
   means responsive to the receipt of said late pulse at said second input terminal for producing a second series of clock pulses of predetermined period, $T_V$, where $T_V < T_C$, the first pulse therefrom occurring when a number, M, of said first series of clock pulses have been produced, said first pulse correlating to the occurrence of said late pulse at said second input terminal, said first counting means having a terminal receptive of said first pulse of said second series for becoming disabled from further counting while producing a signal representative of said number, M; and
   means responsive to pulses from said means producing said first and second series of pulses, respectively, for producing a pulse indicative of the first coincidence of a pulse in said first series and a pulse in said second series, said first coincidence occurring when a number N, of said first series of clock pulses have been produced and when said second means for counting is producing a signal representative of said number N, whereby the values of M, N, $T_C$ and $T_V$ may be utilized to measure the time interval between the arrival of the early pulse and late pulse.

2. In combination as set forth in claim 1 wherein said means producing said pulse indicative of said first coincidence comprises:
   a transferred electron logic device (TELD) having an anode terminal, a cathode terminal, and a Schottky barrier gate means coupled to said means for producing said first and second series of pulses, said TELD being biased such that said TELD produces said pulse indicative of said first coincidence only when a pulse of said first series and said second series occurs concurrently.

3. The combination as set forth in claim 1 wherein there is further included a threshold gate positioned intermediate said first input terminal and said means producing said first series of pulses, said threshold gate comprising:

a transferred electron logic device (TELD) comprising an anode terminal, a cathode terminal and a barrier gate terminal coupled to said first input terminal, said TELD biased such that it is responsive only to input signals above a predetermined threshold value for operating in conduction, said threshold gate further including a field effect transistor coupled to said TELD and responsive to said TELD being in conduction for producing said early pulse.

4. The combination set forth in claim 3 further including a second threshold gate similar to said first mentioned threshold gate, said second threshold gate being positioned intermediate said second input terminal and means producing said second series of pulses.

5. The combination as set forth in claim 3 further including first gate means coupled between said threshold gate and said means for producing said first series of pulses, said first gate means comprising means responsive to a relatively long time duration pulse from said threshold gate for producing a relatively short time duration pulse applied to said means for producing said first series of pulses.

6. The combination as set forth in claim 5 further including second gate means similar to said first gate means, said second gate means being coupled between said second threshold gate and said means producing said second series of pulses.

7. The combination as set forth in claim 1 further including computing means responsive to said first counting means and said second counting means and to said first coincidence indicating pulse for determining the time interval $\Delta T$ between the arrival at said first and second input terminals of said early and late pulse from the formula:

$$\Delta T = (N-1)T_C - (N-M)T_V.$$

* * * * *